(12) United States Patent
Lai

(10) Patent No.: US 7,538,356 B2
(45) Date of Patent: May 26, 2009

(54) COMBINATION ASSEMBLY OF LED AND LIQUID-VAPOR THERMALLY DISSIPATING DEVICE

(75) Inventor: Yaw-Huey Lai, Taipei County (TW)

(73) Assignee: Tai-Sol Electronics Co., Ltd, Taipei (TW)

( * ) Notice: Subject to any disclaimer, the term of this patent is extended or adjusted under 35 U.S.C. 154(b) by 129 days.

(21) Appl. No.: 11/703,167

(22) Filed: Feb. 7, 2007

(65) Prior Publication Data
US 2008/0117601 A1  May 22, 2008

(30) Foreign Application Priority Data
Nov. 22, 2006  (TW)  ............... 95143210 A

(51) Int. Cl.
*H01L 29/18* (2006.01)
(52) U.S. Cl. .......................... 257/88; 257/99
(58) Field of Classification Search .................. 257/88, 257/99, 100, 714
See application file for complete search history.

(56) References Cited
U.S. PATENT DOCUMENTS
5,173,839 A  12/1992  Metz, Jr.
7,098,486 B2 *  8/2006  Chen ........................... 257/99

FOREIGN PATENT DOCUMENTS
TW  M295889  8/2006

* cited by examiner

*Primary Examiner*—Mark Prenty
(74) *Attorney, Agent, or Firm*—Bacon & Thomas, PLLC

(57) ABSTRACT

An LED and liquid-vapor heat-dissipating device assembly is composed of a liquid-vapor heat-dissipating device and at least one LED unit. The liquid-vapor heat-dissipating device includes a metal housing, a predetermined amount of liquid, and a capillary member. The LED unit includes an LED chip mounted to and electrically connected with the metal housing, an insulating board mounted to the surface of the metal housing, an electrode located on the insulating board, a wire having two ends connected with the LED chip and the electrode respectively, and a sealant fully encapsulating the wire and the LED chip and at least partially encapsulating the insulating board and the electrode. Accordingly, the heat generated by the LED chip can be directly conducted to the liquid-vapor heat-dissipating device and, such that the present invention has preferably thermally conductive/dissipating efficiency.

3 Claims, 8 Drawing Sheets

COMBINATION ASSEMBLY OF LED AND LIQUID-VAPOR THERMALLY DISSIPATING DEVICE

BACKGROUND OF THE INVENTION

1. Field of the Invention

The present invention relates generally to light emitting diodes (LEDs), and more particularly, to a preferably thermally conductive/dissipating combination assembly of an LED and a liquid-vapor heat-dissipating device.

2. Description of the Related Art

Since the blue LED was presented to the public, the applications of the LED have been entered a new phase. For example, a full-color LED display has become available and the large full-color highlight LED display screen has become very popular. However, when the highlight LED works, it generates high heat but there is still none of any better solutions to improvement of the thermal dissipation for the LED.

U.S. Pat. No. 5,173,839 proposed a solution to improvement of the thermal dissipation of LED display, disclosing a heat-dissipating device having an LED display chip. The LED display chip is composed of a thermally conductive front panel, a strip of alumina, a thermally conductive pressure-sensitive tape, and a heat sink, for downward conduction of the heat generated by the LED display chip. However, since three intermedia are still located between the heat sink and the LED chip primarily generating the heat, there are too many intermedia located between the same, and thus not only the thermal resistance is large but also the thermal dissipation is slow. Therefore, it is not a good solution.

Taiwan Patent No. M295889 also proposed a method of improving the thermal dissipation of LED, disclosing a heat pipe and a plurality of LEDs mounted to the heat pipe. Each of the LEDs includes a plastic insulating circuit board, an LED chip holder, an LED heat-generation chip, and an LED transparent lens. Although such invention employs the heat pipe having high efficiency of thermal conduction, there is still an intermediate, the LED chip holder and the plastic insulating circuit board, located between the LED heat-generation chip and the heat pipe. In other words, this invention still has the same drawbacks that the thermal resistance is large and the heat dissipation is slow.

SUMMARY OF THE INVENTION

The primary objective of the present invention is to provide a combination assembly of an LED and a liquid-vapor heat-dissipating device, which efficiency of thermal dissipation is preferable.

The foregoing objective of the present invention is attained by the combination assembly composed of a liquid-vapor heat-dissipating device and at least one LED unit. The liquid-vapor heat-dissipating device includes a metal housing, a predetermined amount of liquid located in the metal housing, and a capillary member located in the metal housing. The at least one LED unit includes an LED chip, a wire, an insulating board, an electrode, and a sealant. The LED chip is mounted to a surface of the metal housing and is electrically connected with the metal housing. The insulating board is mounted to the surface of the metal housing. The electrode is located on the insulating board. The wire has two ends connected with the LED chip and the electrode respectively. The sealant fully encapsulates the wire and the LED chip and at least partially encapsulates the insulating board and the electrode. Accordingly, the heat generated by the LED chip can be directly conducted to the liquid-vapor heat-dissipating device and none of any thermal resistance will be generated by other intermediate, such that the present invention has better thermally conductive/dissipating efficiency.

DETAILED DESCRIPTION OF PREFERRED EMBODIMENTS

Figure 1:
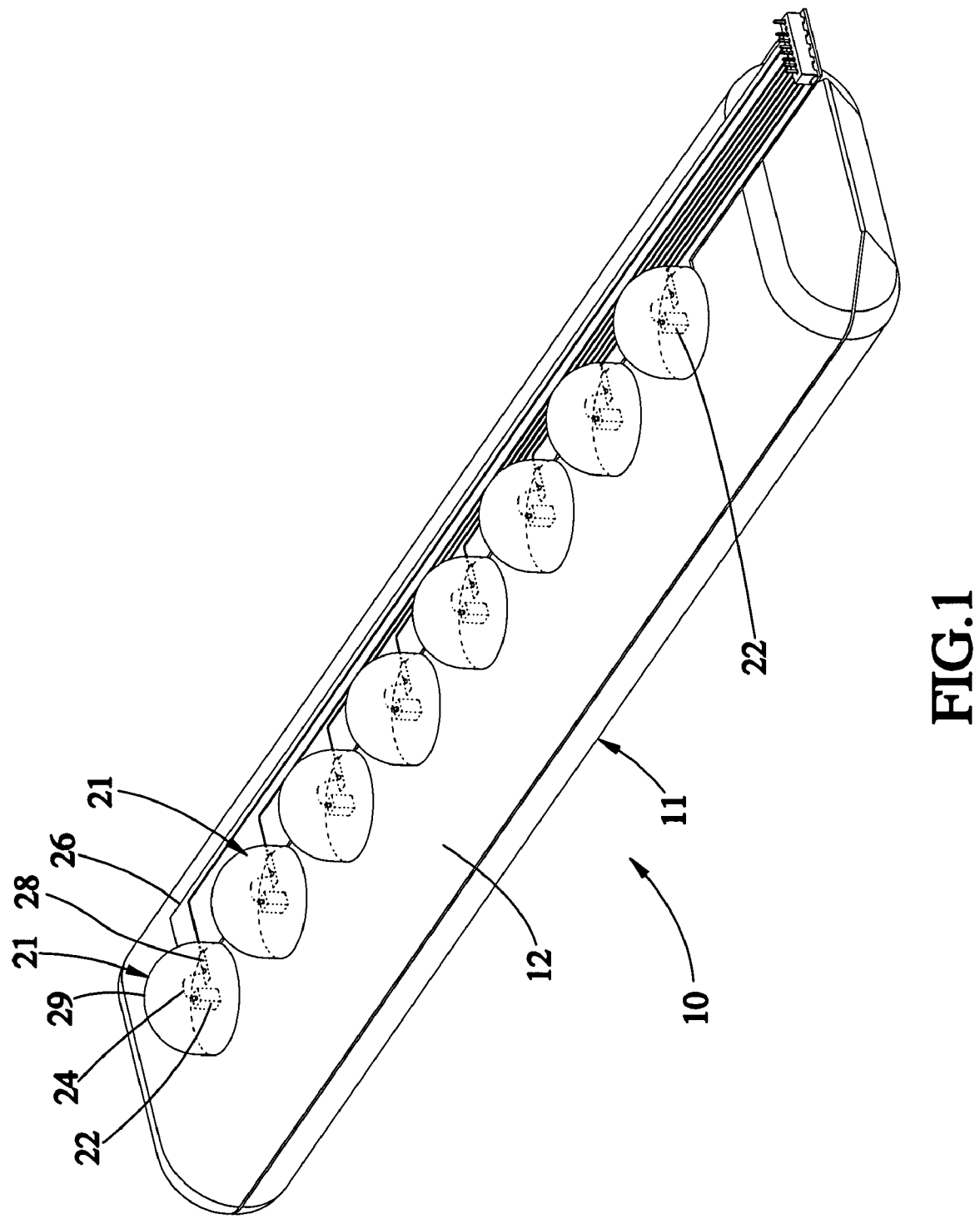
FIG. 1 is a perspective view of a first preferred embodiment of the present invention.
Figure 2:
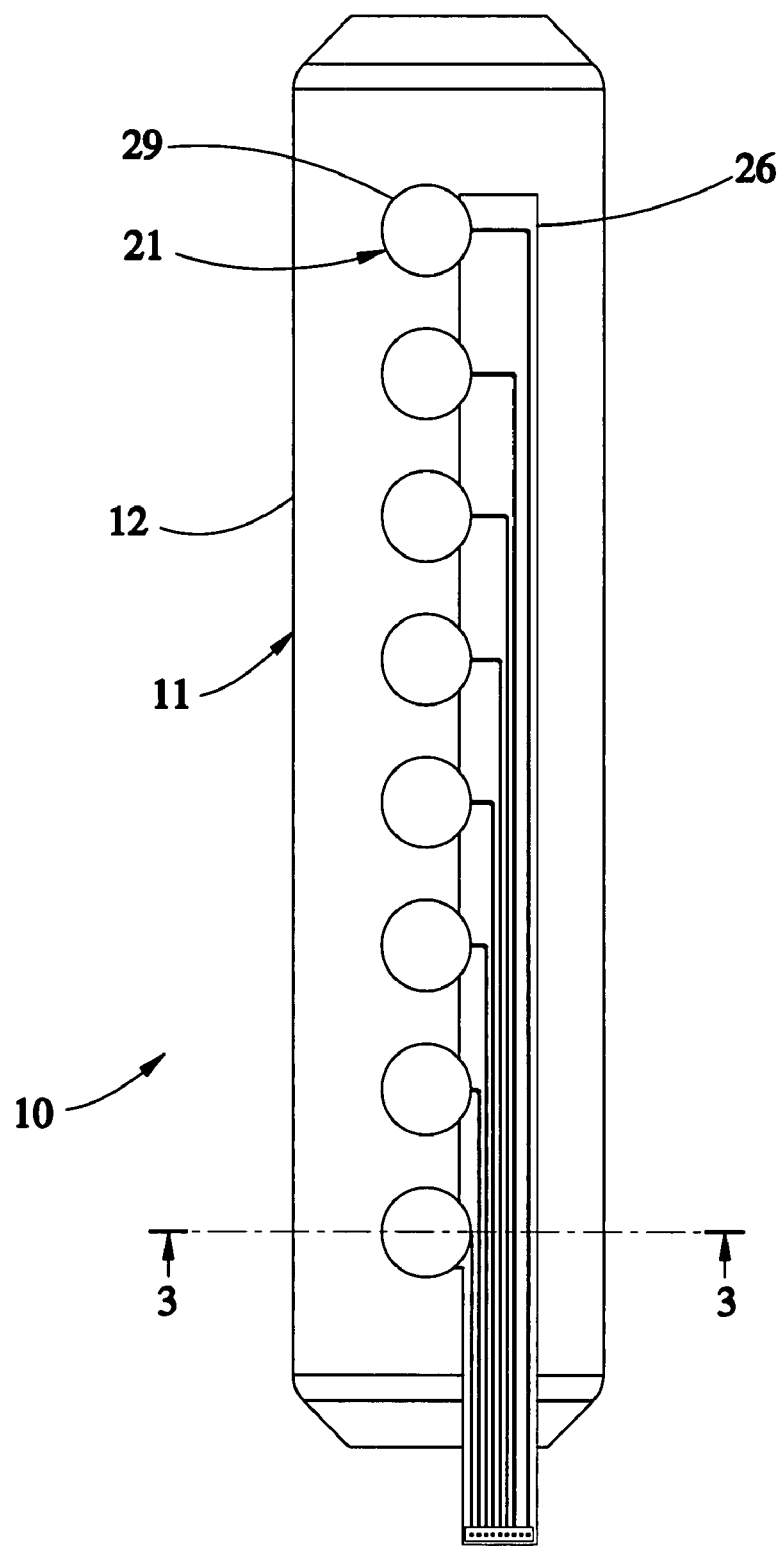
FIG. 2 is a top view of the first preferred embodiment of the present invention.
Figure 3:
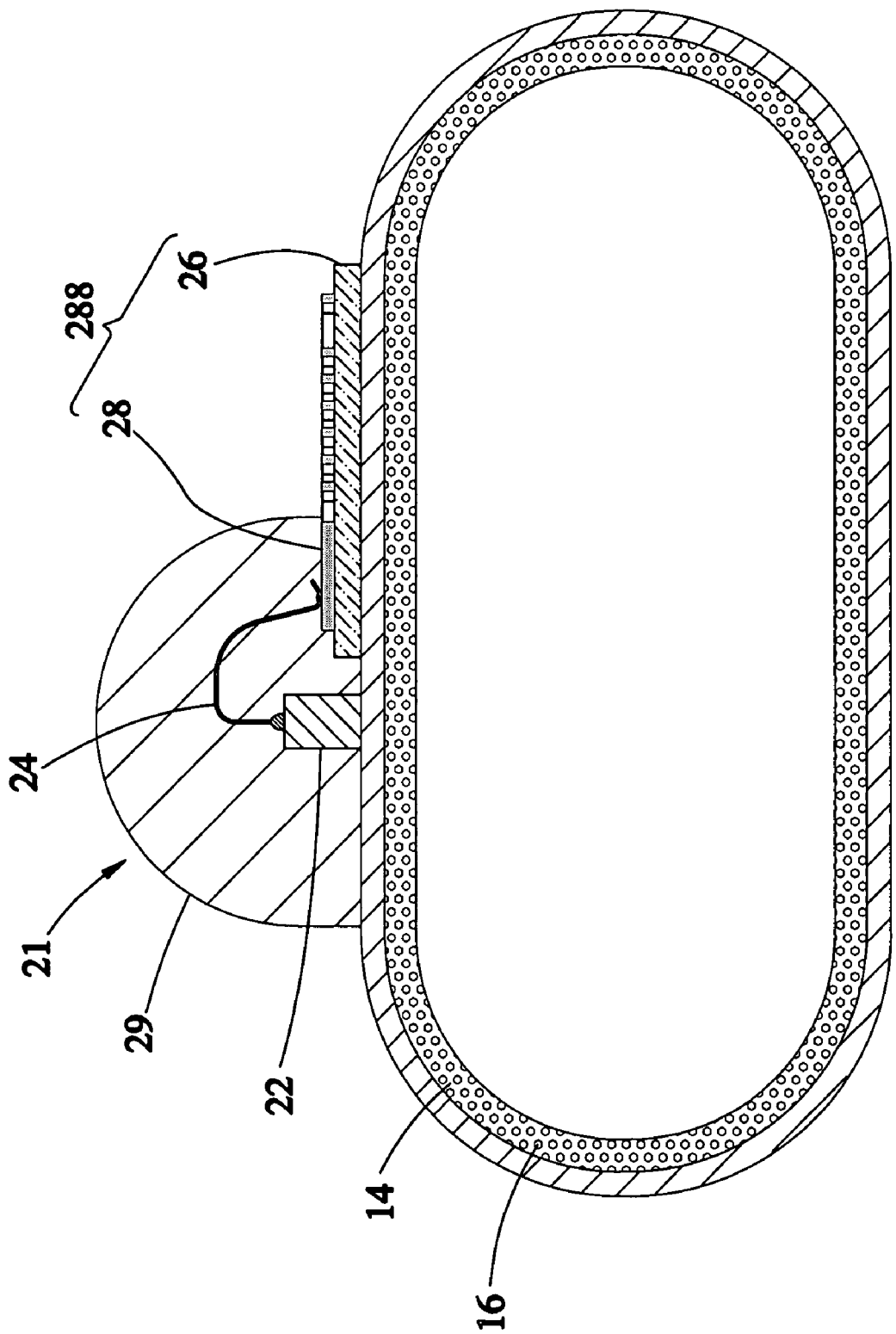
FIG. 3 is a sectional view taken along a line 3-3 indicated in FIG. 2.

Referring to FIGS. 1-3, an LED and liquid-vapor heat-dissipating device assembly 10, constructed according to a first preferred embodiment of the present invention, is composed of a liquid-vapor heat-dissipating device 11 and a plurality of LED units 21.

The liquid-vapor heat-dissipating device 11 includes a metal housing 12, a predetermined amount of liquid 14 located therein, and a capillary member 16 located therein, for providing high thermal conductivity. The metal housing 12 is a heat pipe made of copper in this embodiment. The capillary member 16 can be sintered copper powder or webby structure or grooves formed in an inner sidewall of the housing 12. Since the internal structure of the liquid-vapor heat-dissipating device 11 belongs to the prior art, no more description is necessary.

The LED units 21 are connected in series with one another and arranged on a surface of the housing 12. Each of the LED units 21 includes an LED chip 22, a wire 24, an insulating board 26, an electrode 28, and a sealant 29. The LED chips 22 are mounted to the surface of the housing 12 for electric conduction with the housing 12. The insulating boards 26 are mounted to the surface of the housing 12. The electrodes 28 are located on the insulating board 26. The wires 24 each have two ends connected with the LED chip 22 and the electrode 28 respectively. The sealants 29 fully encapsulate the wires 24 and the LED chips 22 and partially encapsulate the insulating boards 26 and the electrodes 28, i.e. the electrodes 28 are partially exposed outside the sealants 29 respectively.

The insulating boards 26 are incorporated to form a plate-like member. The plate-shaped member and the electrodes 28 are incorporated to form a circuit board 288. In light of this, the LED chips 22 are electrically connected with the metal housing 12 (cathode), and the wires 24 are connected with the electrodes 28 (anode) to be exposed outside the sealant 29 and to be defined as contacts on the circuit board 288 for electric connection with the LED chips 22 and for controlling illumination of the same.

When the present invention is actually operated, an electronic driving device (not shown) can be connected with the circuit board 288, each of the electrodes 28 can be electrically conducted to drive the LED chip 22 to illuminate, and each LED chip 28 is electrically connected with the metal housing 12 which is the common cathode. The heat generated while each of the LED chips 22 illuminates will be directly conducted to the metal housing and then nearly immediately be dissipated outside through the high thermal conductivity of the liquid-vapor heat-dissipating device 11, such that the LED chips 22 can be excellently thermally conducted/dissipated.

Figure 4:
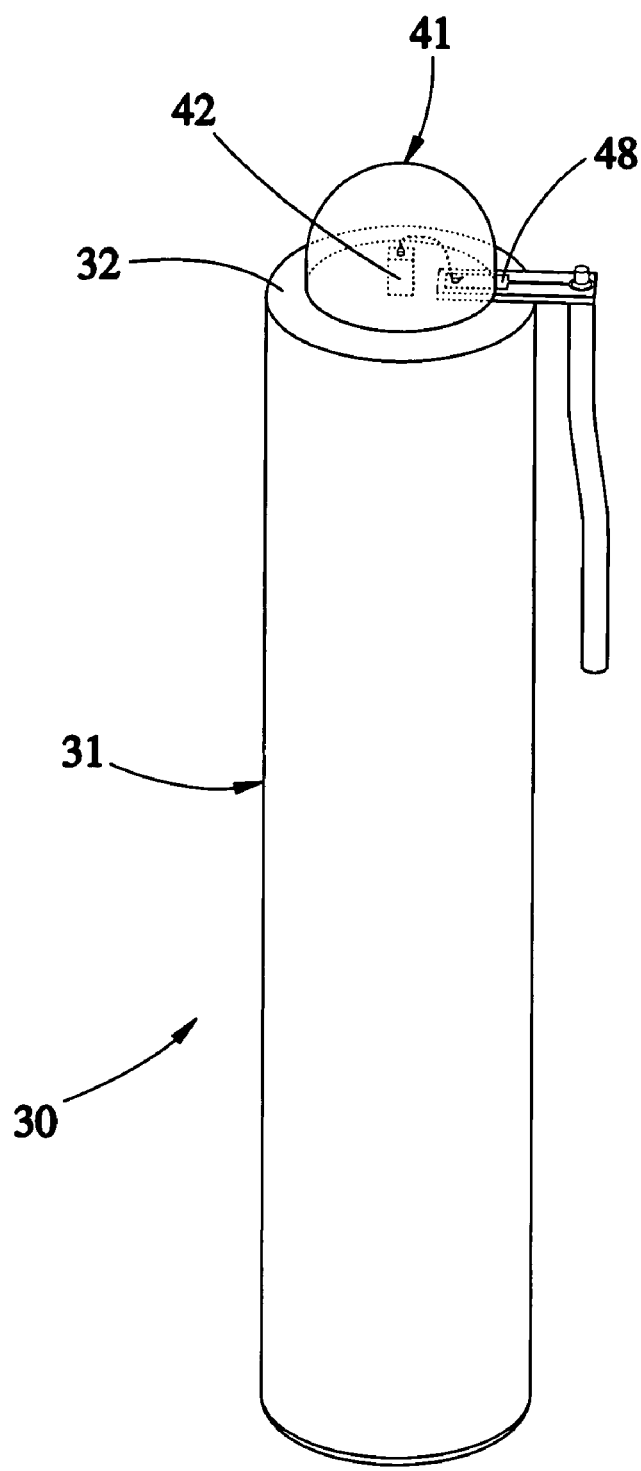
FIG. 4 is a perspective view of a second preferred embodiment of the present invention.

Referring to FIG. 4, an LED and liquid-vapor heat-dissipating device assembly 30, constructed according to a second preferred embodiment of the present invention, is similar to the first embodiment of the present invention but different as recited below.

The liquid-vapor heat-dissipating device 31 is provided with one end having an end face 32. There is only one LED unit in this embodiment. The LED unit 41 is mounted on the end face 32. While the electrode 48 is electrically conducted, the LED chip 42 can be driven to illuminate and the heat of the LED chip 42 can be likewise conducted/dissipated through the liquid-vapor heat-dissipating device 31. Since the second embodiment is the same as the first embodiment in operation and effect, no more detailed description is necessary.

Figure 5:
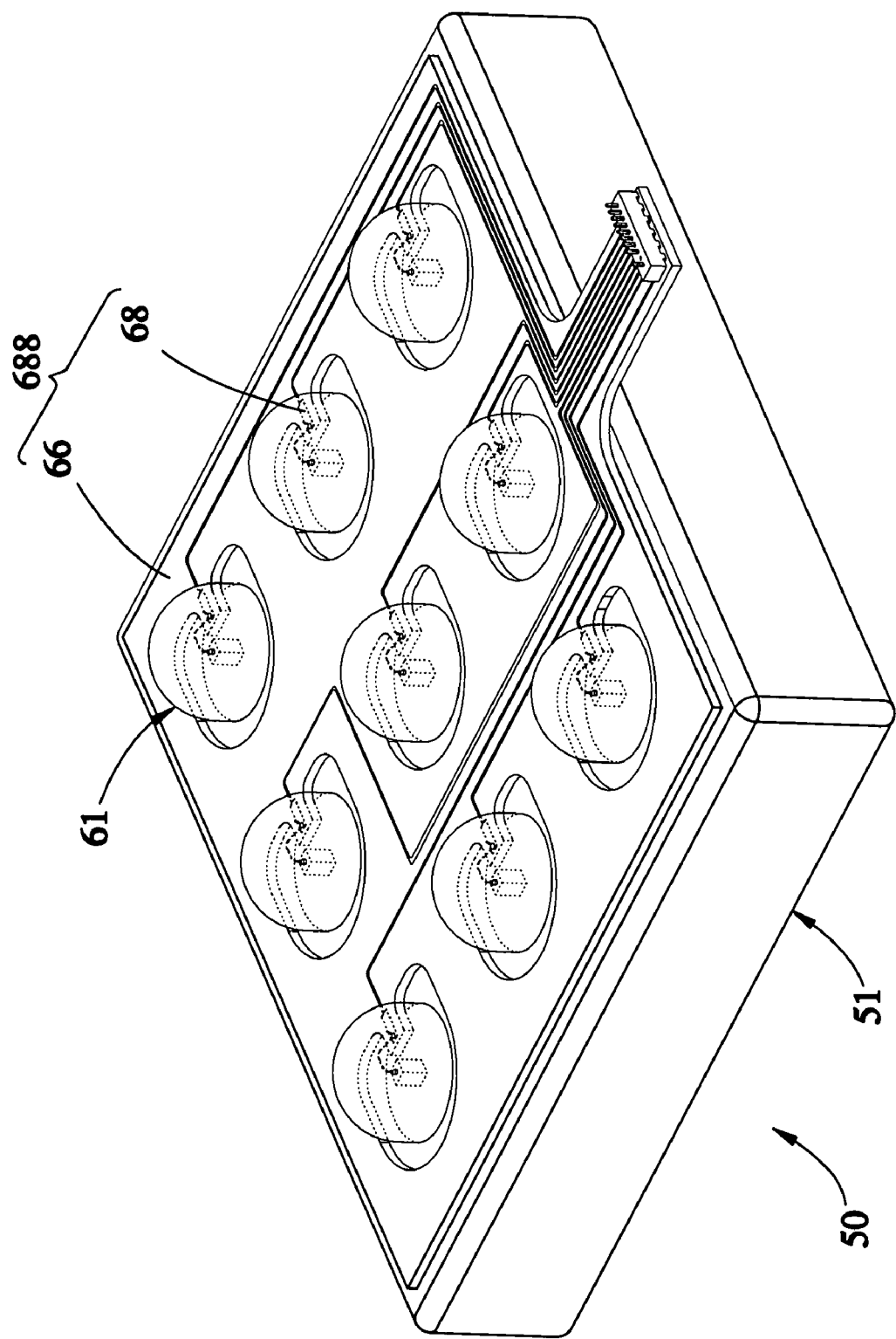
FIG. 5 is a perspective view of a third preferred embodiment of the present invention.
Figure 6:
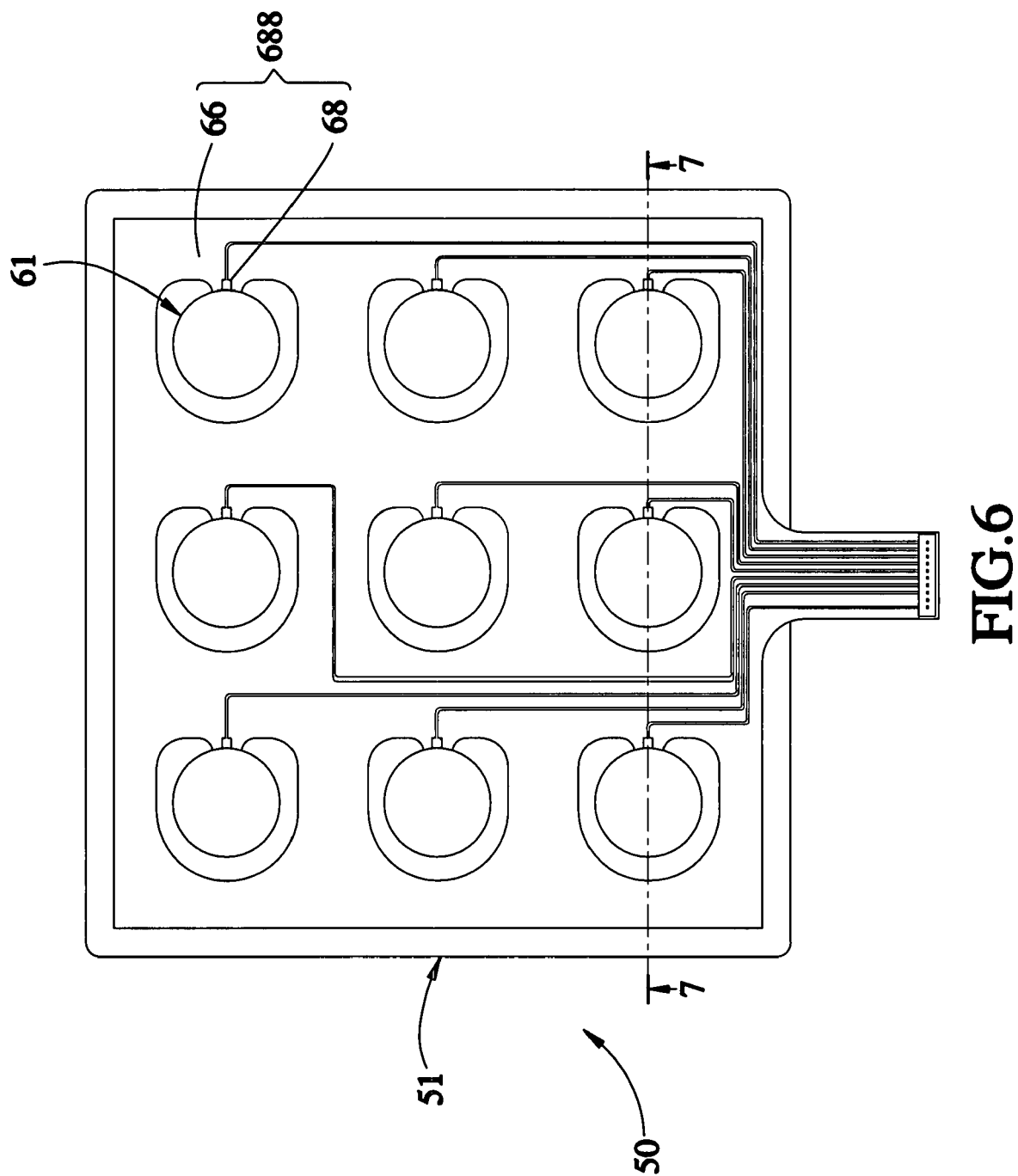
FIG. 6 is a top view of the third preferred embodiment of the present invention.
Figure 7:
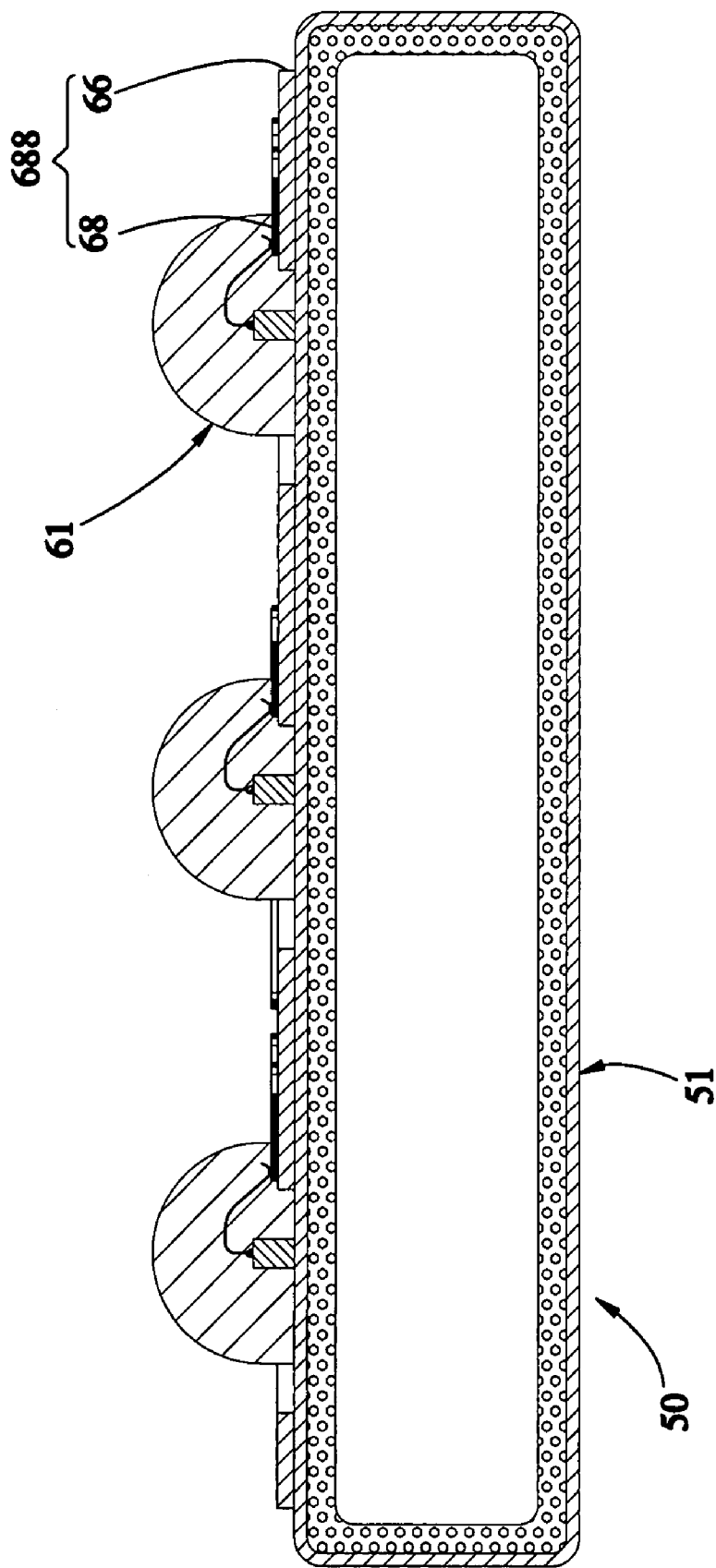
FIG. 7 is a sectional view taken along a line 7-7 indicated in FIG. 6.

Referring to FIGS. 5-7, an LED and liquid-vapor heat-dissipating device assembly 50, constructed according to a third preferred embodiment of the present invention, is similar to the first embodiment of the present invention but different as recited below.

The liquid-vapor heat-dissipating device 51 is a flat chamber in this embodiment. The LED units 61 are arranged in matrix on the liquid-vapor heat-dissipating device 51. The insulating boards 66 are incorporated to form a plate-like member. The plate-like member and the electrodes 68 are incorporated to form a circuit board 688. Since the third embodiment is the same as the first embodiment in operation and effect, no more detailed description is necessary.

Figure 8:
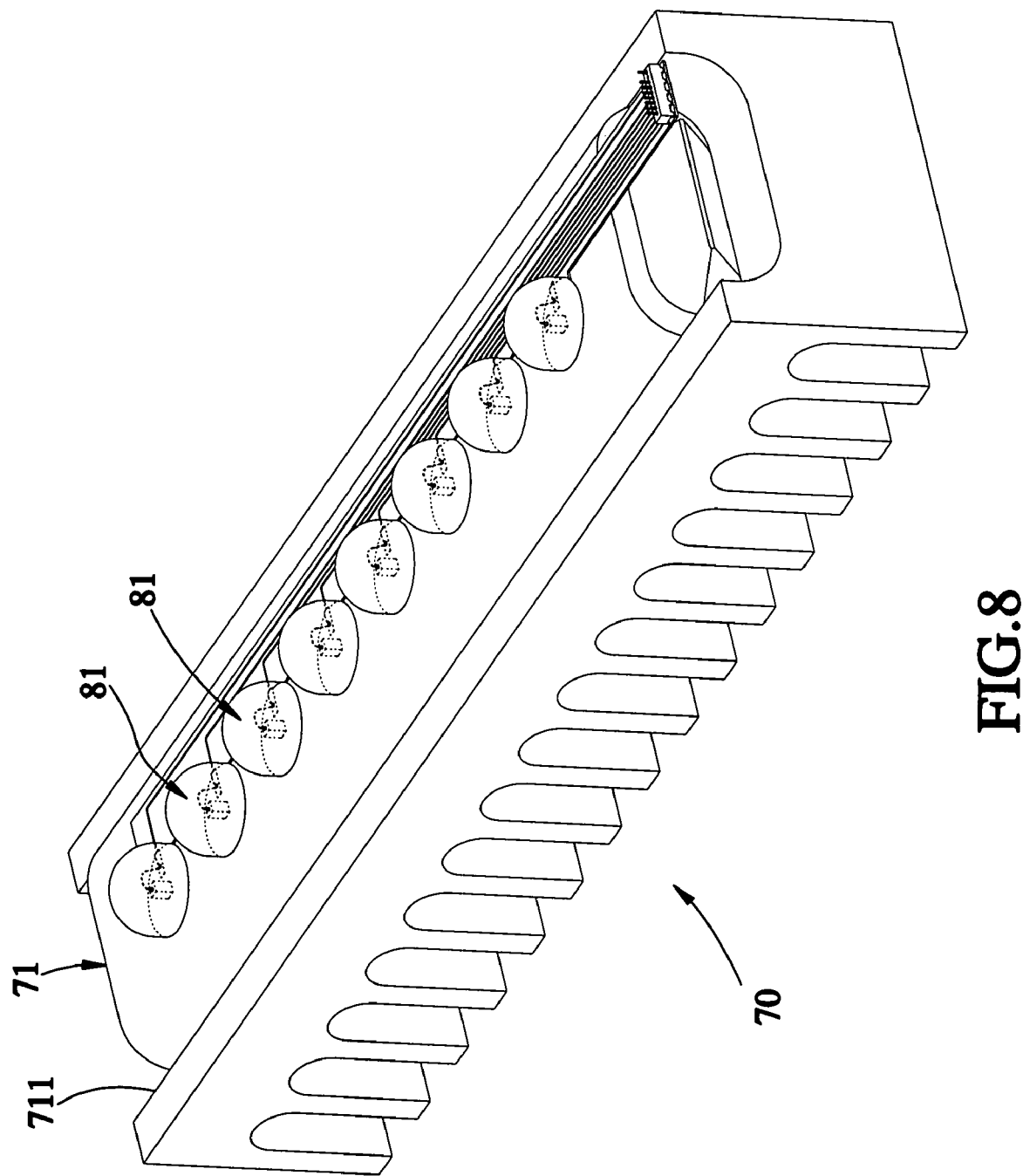
FIG. 8 is a perspective view of a fourth preferred embodiment of the present invention.

Referring to FIG. 8, an LED and liquid-vapor heat-dissipating device assembly 70, constructed according to a fourth preferred embodiment of the present invention, is similar to the first embodiment of the present invention but different as recited below.

The liquid-vapor heat-dissipating device 81, which is a heat pipe in this embodiment, is connected with a heat sink 711. The heat of the LED units 81 can be conducted to the heat sink 711, which is provided with large area for thermal dissipation, and then be better dissipated. Since the fourth embodiment is the same as the first embodiment in operation and effect, no more detailed description is necessary.

In conclusion, the present invention is better than the prior art because the present invention does not have the intermediate, i.e. the chip holder and the circuit board, located between the LED chips and the liquid-vapor heat-dissipating device to greatly reduce the thermal resistance and to directly conduct/dissipate the heat outward through the liquid-vapor heat-dissipating device.

Although the present invention has been described with respect to specific preferred embodiments thereof, it is no way limited to the details of the illustrated structures but changes and modifications may be made within the scope of the appended claims.

What is claimed is:

1. A combination assembly of at least one LED unit and a liquid-vapor heat-dissipating device, wherein:

said liquid-vapor heat-dissipating device has a metal housing, a predetermined amount of liquid located in said metal housing, and a capillary member located in said metal housing; and said at least one LED unit is mounted to a surface of said metal housing and has an LED chip, a wire, an insulating board, an electrode, and a sealant, said LED chip being mounted to the surface of said housing and electrically conducted with said housing, said insulating board being mounted to the surface of said housing, said electrode being located on said insulating board, said sealant fully encapsulating said wire and said LED chip and at least partially encapsulating said insulating board and said electrode, wherein said insulating board and said electrode are incorporated to form a circuit board, said liquid-vapor heat-dissipating device is a heat pipe, said at least one LED unit is numerous and said LED units are connected in series and arranged on said liquid-vapor heat-dissipating device, and said insulating board and said electrode of each of the LED units are incorporated to form said circuit board.

2. A combination assembly of at least one LED unit and a liquid-vapor heat-dissipating device, wherein:

said liquid-vapor heat-dissipating device has a metal housing, a predetermined amount of liquid located in said metal housing, and a capillary member located in said metal housing; and said at least one LED unit is mounted to a surface of said metal housing and has an LED chip, a wire, an insulating board, an electrode, and a sealant, said LED chip being mounted to the surface of said housing and electrically conducted with said housing, said insulating board being mounted to the surface of said housing, said electrode being located on said insulating board, said sealant hilly encapsulating said wire and said LED chip and at least partially encapsulating said insulating board and said electrode, wherein said insulating board and said electrode are incorporated to form a circuit board, said liquid-vapor heat-dissipating device is a heat pipe, said liquid-vapor heat-dissipating device is provided an end face located at an end thereof, and said at least one LED unit is mounted to said end face of said liquid-vapor heat-dissipating device.

3. A combination assembly of at least one LED unit and a liquid-vapor heat-dissipating device, wherein:

said liquid-vapor heat-dissipating device has a metal housing, a predetermined amount of liquid located in said metal housing, and a capillary member located in said metal housing; and said at least one LED unit is mounted to a surface of said metal housing and has an LED chip, a wire, an insulating board, an electrode, and a sealant, said LED chip being mounted to the surface of said housing and electrically conducted with said housing, said insulating board being mounted to the surface of said housing, said electrode being located on said insulating board, said sealant fully encapsulating said wire and said LED chip and at least partially encapsulating said insulating board and said electrode, wherein said liquid-vapor heat-dissipating device is a flat chamber, said at least one LED unit is numerous and said LED units are arranged in matrix on said liquid-vapor heat-dissipating device, and said insulating board and said electrode of each of the LED units are incorporated to form said circuit board.

* * * * *